United States Patent [19]

Smith et al.

[11] 3,929,491

[45] Dec. 30, 1975

[54] BONDED SILVER ARTICLE, COMPOSITION, AND METHOD OF BONDING SILVER TO A CERAMIC SUBSTRATE

[75] Inventors: Baynard R. Smith; Arnold W. Treptow, both of North Palm Beach, Fla.

[73] Assignee: Electro Oxide Corporation, Palm Beach Gardens, Fla.

[22] Filed: Jan. 24, 1974

[21] Appl. No.: 436,352

[52] U.S. Cl. ...................... 106/1; 252/514; 427/125

[51] Int. Cl.[2] ............................................ C09D 5/24

[58] Field of Search ..... 106/1; 252/514; 117/123 C, 117/124 B, 227; 427/125

[56] References Cited

UNITED STATES PATENTS

| | | | |
|---|---|---|---|
| 3,440,182 | 4/1969 | Hoffman | 106/1 |
| 3,497,384 | 2/1970 | Pirigyi | 106/1 |
| 3,763,409 | 10/1973 | Sheard | 106/1 |
| 3,799,891 | 3/1974 | Smith | 252/514 |
| 3,830,651 | 8/1974 | Minneman et al. | 106/1 |

*Primary Examiner*—Lorenzo B. Hayes
*Attorney, Agent, or Firm*—Paul Maleson; Morton J. Rosenberg

[57] ABSTRACT

A composition for, as well as a method of bonding silver to a ceramic substrate and a bonded silver article which includes a composition of silver, cadmium oxide, copper oxide, rhuthenium oxide and platinum. An initial mixture of between 0.5%–5.0% by weight of the total composition of cadmium oxide and copper oxide is provided in predetermined weight ratios. The initial mixture is blended with between 0.25%–2.0% of platinum powder and 0.50%–4.0% rhuthenium oxide to form an intermediate mixture. Silver powder is added to form the total composition mixture. The total composition mixture is blended in an organic binder and applied to a ceramic substrate. The coated ceramic article is within a temperature range of 860° to 925°C. Copper oxide crystals impregnate the ceramic substrate and form a high strength bond between the silver layer and the ceramic substrate. It is believed that the platinum forms an alloy with the rhuthenium so that there is little leaching of the silver coating when solder is applied.

16 Claims, No Drawings

BONDED SILVER ARTICLE, COMPOSITION, AND METHOD OF BONDING SILVER TO A CERAMIC SUBSTRATE

BACKGROUND OF THE INVENTION

1. Field of the Invention

This invention pertains to compositions and methods for bonding silver to ceramic substrates. In particular this invention relates to the field of producing solderable silver coatings on ceramic substrates which maintain a high strength bond coating to the substrate. More in particular, this invention pertains to the field of bonding silver to ceramic substrate using a combined copper oxide, cadmium oxide, platinum, and rhuthenium oxide composition as the main bonding agent. Still further, this invention relates to the field of ceramic articles of manufacture having a silver layer bonded thereto.

2. Prior Art

Compositions and methods for bonding silver to ceramic substrates are known in the art. Additionally, ceramic articles of manufacture are known which have a silver layer adhered thereto. However, in general, the mechanics of bonding silver to ceramic material has included the addition of a predetermined percentage of glass frits into the silver. Originally, the glass frits were incorporated in an organic binder and mixed or blended with silver powder prior to the application to the ceramic substrate. The composition was then heated to a temperature approaching the melting temperature of the glass which essentially wet the base ceramic surface and the silver to serve as a bonding agent.

However, the problems of using only glass frits were twofold: (1) when solder was applied to the silver, it was found that the silver was scavenged away; and (2) the inclusion of glass frits did not optimize either the bonding strength or the electrical conductivity of the silver layer. To solder leads and other devices to the silver was very difficult since the solder was found to alloy with the silver and cause a leaching effect.

Further, it was found that an acceptable bond strength of the silver to the substrate was found when the glass frit weight percentage of the glass frits reached into the neighborhood of between 10.0%–20.0% of the total composition weight. However, the electrical resistivity of such compositions may be as high as 0.03 ohms/square/mil. Since a major use of such bonds is in the production of printed circuits, any increased electrical resistivity is a distinct disadvantage.

In order to provide a more solderable silver layer, prior compositions included the introduction of palladium into the silver and glass frit mixture. It was found that the addition of palladium tended to slow down any alloying effect between the silver and the solder applied thereto. The palladium content in prior compositions was as high as 30.0% to 40.0% of the composition weights. In those high concentrations, the silver/solder alloying action was found to be slow enough to permit reasonably good soldering of the silver layer. The price of palladium has increased, thereby driving down the percentage of palladium economically permissible in the silver, glass frit compositions.

At the present time, it is standard to use approximately 20.0% by weight of palladium with respect to the total composition of silver, and palladium. This has been found to be the lowermost region of palladium content which could be tolerated without degrading the soldering ability of the silver layer. However, it has been found that even when 20.0% palladium is used, the bond strength of the silver layer to the solder can be drastically reduced when a solder joint is heat treated at 130°C. for 24 hours (a standard test utilized in measuring soldering effectiveness).

Additionally, where large quantites of glass frits or other known bonds have been used, the coated silver layer thermal conductivity was found to be low. This disadvantage has the effect of producing unwanted thermal gradients between the ceramic substrate and any mounted circuitry. Further, in hybrid circuits, in some prior compositions where glass frits were used, it has been found that the glass frits contained in the silver were not compatible with glass frits in resistor and dielectric devices. This condition was found to be the possible cause of formation of bubbles and voids between mating surfaces.

SUMMARY OF THE INVENTION

A metalizing composition which comprises an intimate mixture on a weight basis, of: (a) about 0.5%–5.0% of an initial mixture of cadmium oxide powder and at least one copper oxide powder selected from the group consisting of cuprous oxide and cupric oxide, the copper oxide and cadmium oxide powder are combined in a weight ratio of between 0.15–6.0 parts of the copper oxide to 1.0 part of the cadmium oxide; (b) about 0.25%–2.0% of at least one particulate material selected from the group consisting of platinum, iridium, rhodium, and osmium powder; (c) about 0.50%–4.0% of rhuthenium oxide; and, (d) the balance of the intimate mixture being at least one silver particulate material selected from the group consisting of silver and silver oxide.

DESCRIPTION OF THE PREFERRED EMBODIMENTS

In accordance with the invention to be described in the following paragraphs, there is provided a composition and method for bonding silver to an alumina or ceramic substrate utilizing a combination of cadmium oxide, copper oxide, rhuthenium oxide, and platinum or another element from a group VIII of the Periodic Table. As a direct outgrowth of the composition and method as herein detailed, there is also provided an article of manufacture which results in a ceramic substrate having a silver layer bonded thereto. All of the embodiments of the invention as herein described pertain to the bonding of silver to a ceramic alumina substrate.

Silver layers bonded to ceramic substrates are important in the production of printed circuits on ceramics in general. In particular, the use of silver layers is of considerable importance in the production of hybrid and integrated circuits which are formed in many cases on ceramic substrates. One of the major disadvantages found in using prior compositions and methods for bonding the silver layers to the ceramic substrates has been the difficulty in producing a solderable conductive surface. In prior cases, it has been found that the silver when contacted by the solder tends to leach and scavenge away. Further, once soldering has been effected to a silver layer, one test is in the heat treating of the solder joint. In standard tests where the soldered joint is made to the silver layer, the entire assembly is heat treated at 130°C. for a period of 24 hours. It has been found that during heat treatment and even during hot dipping of the silver layer in solder, that there is a loss of bonding strength of the layer to the ceramic as well as a loss of strength in the soldered joint itself.

It is believed that the addition of platinum or other elements from group VIII of the Periodic Table as described in the following paragraphs, tend to form an alloy with the rhuthenium to prevent leaching of silver in hot molten solder. Additionally, the rhuthenium has been found to have an important effect on the durability during heat treatment and hot dipping of the coated layer as to the maintenance of the bonding strength of the coating to the substrate. The addition of the copper oxide and cadmium oxide provides an important bonding parameter to allow the silver layer to be bonded to the substrate without the addition of glass frits. As is well known, the addition of glass frits to a silver layer does permit bonding but reduces the electrical conductivity and further decreases the thermal conductivity to provide possible unwanted thermal gradients.

The metallizing or bonding compositions of the invention comprise intimate mixtures on a weight percentage basis of: (a) about 0.5%–5.0%, preferably 0.5%–2.0% of an initial mixture of cadmium oxide powder and at least one copper oxide powder selected from the group consisting of cuprous oxide and cupric oxide with the copper oxide and cadmium oxide being combined in a weight ratio of between 0.15–6.0, preferably 2.0–4.0 parts of the copper oxide to 1.0 parts of the cadmium oxide; (b) about 0.25%–2.0%, preferably 0.5%–1.0% of at least one particulate material selected from the group consisting of platinum, iridium, rhodium, and osmium powder; (c) about 0.50%–4.0%, preferably 0.5%–2.0% of rhuthenium oxide; and, (d) the balance of the intimate mixture being at least one silver particulate material selected from the group consisting of silver and silver oxide.

The cadmium oxide, copper oxide, rhuthenium oxide, silver, and platinum or other described element in group VIII of the Periodic Table comprise a total composition mixture which is added to an organic binder and mixed thoroughly before application to a ceramic substrate. The organic binder is devoid of glass frits and comprises approximately between 10.0%–95.0% of the weight of the total composition mixture. The inventive compositions as herein described constitute a preferred group of bonding or metallizing compositions which permit solderability of the silver layer. The bonded layers as produced in the present invention have a high joint or tensile loading strength for layered thicknesses ranging from 100–1000 millionths of an inch. Additionally, the electrical resistance of the bond constituting the invention is substantially less than silver pastes containing glass frits.

As is the usual case for bonds or metallizing compositions of this nature, such are usually applied to a ceramic substrate through silk screening, printing, brushing or some like technique. This application is generally performed in an ambient air environment at a temperature approximating normal room conditions (i.e., 22°C.), although such is not critical to the inventive concept. The coated substrate is generally fired in an oven having an oxidizing atmosphere between the temperature ranges of 860°C. and 925°C., with a preferred temperature firing range between 890°C.–910°C. The coated ceramic substrate is maintained at peak temperature in the oven for a time interval between 5–15 minutes, preferably between 5–7 minutes for firing purposes.

The copper oxide particles (cuprous oxide or cupric oxide) and cadmium oxide powder or particles used in this composition are generally milled or ground to a dimensional size of less than 1 micron in length. The cadmium and powder and copper oxide powder forming an initial mixture is commercially available from a number of companies in the field such as Fisher Scientific Company, Chemical Manufacturing Division, located in Fair Lawn, New Jersey. The silver powder or particulate which is commercially bought has a dimensional size of between submicron to 5 micron range. The platinum powder is generally between 2–5 microns in length with the rhuthenium oxide powder being generally in the sub-micron-5 micron dimensional size range.

The method invention for producing a solderable silver bonding layer on a ceramic substrate having high bonding qualities as well as being highly thermally conductive and low in electrical resistivity is disclosed in the following paragraphs.

Initially, copper oxide (cupric oxide, cuprous oxide) particles are mixed with cadmium oxide powder in specific weight percentages of the total composition mixture as well as specific weight ratios with respect to each other to form an initial mixture. The now combined copper oxide and cadmium oxide particulates are then mixed with each other and incorporated into a wetting agent such as toluol, benzene, alcohol, acetone, or some like composition. The initial mixture plus the wetting agent are ball milled or pass through some like technique for a predetermined time within the approximating range between 2 and 24 hours. This step breaks down the combined copper oxide and cadmium oxide particulates to a fine powder preferably in teh submicron dimensional size range. The time of milling is not critical to the inventive concept as herein defined but such milling or grinding techniques are maintained until the particulates have substantially reached the fine powder texture desired.

The combined initial mixture is then dried in a standard oven until the copper oxide powder and cadmium oxide powder is substantially devoid of a volatile material. In practice, the oven has been maintained at a temperature approximating 100°C. for between one and five hours dependent on the weight of the combined mixture being dried. The oven or other drying mechanism temperature and time of drying for this step is not critical to the inventive concept, with the only restriction placed on these parameters being that upon termination of this drying step, that the remaining copper oxide and cadmium oxide powder be substantially free of the volatile material used in forming the initial mixture.

The initial mixture is then blended into a predetermined quantity of rhuthenium oxide and a predetermined weight percentage of at least one particulate material selected from the group consisting of platinum, rhodium, iridium, and osmium. This combination now forms an intermediate composition. The intermediate composition is then blended into a commercially available organic binder in predetermined weight percentages. The blending step is accomplished in a standard paint mill (wet grinder), tumbler or some like mechanism. The blending in this manner disburses the various composition particulates and substantially breaks up possibly existing agglomerates. The organic binder used in this step has a weight percentage range between 10% and 95% of the total mixture composition. In this phase of the process step, organic binders such as beta terpinol, ethyl cellulose mixture, pine oil, methyl cellulose or like compositions may be used. In actual practice, commercially available organic binders have been used including, Ferro Vehicle Corp., Binder H-216, Alpha Metals Corp., Binder Reliafilm No. 5181 and L. Reusche & Co., Binder Medium No. 163-C.

Silver or silver oxide powder is then mixed into the intermediate mixture plus the organic binder. The inclusion of the silver powder into the intermediate mixture forms the total mixture composition which comprises the copper oxide, cadmium oxide, rhuthenium oxide, silver, and platinum or other predetermined elements from group VIII of the Periodic Table.

The total composition mixture in the organic binder is then mixed or blended in a wet grinder, wet three roll grinder, paint mill mechanism, or other commercially available mixing mechanisms well known in the art. In this step, the intermediate mixture is evenly disbursed into the surrounding silver powder. The solid particles are preferably wetted in an even manner and a substantially homogeneous blend is formed of the total mixture composition.

The total mixture composition is then applied to a ceramic or alumina substrate through silk screening, printing, brushing, hand dipping, or another number of methods not important to the inventive concept as herein detailed. The application of the total mixture composition to the ceramic substrate is accomplished preferably in an ambient atmosphere condition, however, such is not important to the invention. In this manner, there is obtained a ceramic substrate coated with a total composition mixture.

The coated ceramic substrate is then introduced into an oven or other heating mechanism. The coated substrate is brought to a temperature equilibrium conditions within a range extending between 860° and 925°C., having a preferred temperature range between 890° and 910°C. The coated substrates are maintained within the oven having an oxidizing atmosphere for a period between 5 minutes and 15 minutes, preferably between 5–7 minutes. In this manner, the coated ceramic substrate is fired and may result in a coating thickenss of application ranging between 100–1000 millionths of an inch.

During the firing step, substantially all of the organic binder is driven off into the surrounding environment with possibly only residual amounts left in the coating. It has been observed that portions of the copper oxide particles impregnate the alumina or ceramic substrate to provide a bonding mechanism of the silver layer to the substrate. The coated ceramic substrates are then cooled to normal room conditions by natural convection transport. The substrates are then subjected to soldering, and bond strength tests as is detailed in Examples 1–10.

The composition and method of production as herein detailed results in a ceramic article of manufacture. According to the present invention there is provided a ceramic article having a fired coating wherein the fired coating layer includes a mixture of silver, cadmium oxide, copper oxide, rhuthenium oxide, and platinum or other element from group VIII of the Periodic Table. The ceramic fired coating has a preferred thickness range between 100–1000 millionths of an inch. Firing temperatures for the coating range between 860° and 925°C. with a preferred temperature range between 890° and 910°C. The coated ceramic is maintained at a predetermined temperature for a period between 5 and 15 minutes, preferably between 5–7 minutes. The resulting ceramic article produced provides a ceramic substrate having a strong silver bonded layer which is easily solderable.

The following examples illustrate the use of cadmium oxide, copper oxide, rhuthenium oxide, and platinum or other predetermined elements within group VIII of the Periodic Table to form a solderable bond between a silver layer and a ceramic or alumina substrate. Each of the examples set forth the basic formulations of the metallizing compositions of the invention. In each of the examples, the copper oxide used was both cuprous oxide and cupric oxide. Additionally, in each of the examples both silver and silver oxide were used. Thus, for each example, four test runs were made, two for cuprous oxide and cupric oxide and two for silver and silver oxide wherein all other parameters were held constant. In all example cases for the cupric and cuprous oxide runs, the bonding results were substantially identical. Additionally, for both the silver and silver oxide runs, all results for bonding and solderability effects were substantially the same. With reference to the terminology used, cadmium oxide and copper oxide formed the initial mixture. Further, the cadmium oxide, copper oxide, rhuthenium oxide and platinum or other group VIII element form the intermediate mixture. The total composition mixture was formed by adding the silver or silver oxide powder to the intermediate mixture. The weight percentages as shown in each example refer to the percentage of that component in relation to the total composition mixture.

EXAMPLE 1

| | |
|---|---|
| Cadmium oxide + Copper Oxide | 1.0% |
| Platinum | 0.5% |
| Rhuthenium Oxide | 1.0% |
| Silver | 97.5% |

Cadmium oxide particles were mixed thoroughly with copper oxide particles through ball milling. The weight composition ratio of this mixture was 3 parts of copper oxide to 1.0 parts of cadmium oxide. The copper oxide and cadmium oxide mixture were incorporated into toluol and ball miled to break down the mixture particle sizes into the sub-micron range. The mixture was then dried in a standard oven being maintained at approximately 100°C. Platinum and rhuthenium oxide particles were blended together with the copper oxide/cadmium oxide mixture and added to a standardly used organic binder Reusche's Medium 163-C. Silver powder was then mixed into the combination of cadmium oxide, copper oxide, platinum, rhuthenium oxide and organic binder. The mixing was accomplished through use of a wet three roll grinder and provided for resultant homogeneity of the metallizing composition. The composition was silk screened onto several pieces of ceramic substrate. The coated ceramic substrates were introduced into an oven maintained at 900°C. having an oxidizing atmosphere. The substrates were held in the oven for approximately 6 minutes, then removed and cooled to room temperature by natural convection. The resulting bond of the silver to the ceramic substrate was found to be excellent. Crystalline growth was observed and the coating was bright metallic in surface finish. Attempts to remove the coating from the substrate resulted in destruction of the ceramic. The coated ceramics were hot dipped into soft solder and no appreciable loss in bond strength was observed. The solder used in this example was 62% tin, 36% lead with 2.0% silver. The substrates were held in 225°C. solder for 120 seconds. No scavenging of the silver was seen when the solder was applied to the coating.

EXAMPLE 2

| | |
|---|---|
| Cadmium + Copper Oxide | 1.0% |
| Platinum | 0.25% |
| Rhuthenium Oxide | 1.0% |
| Silver | 97.75% |

Cadmium oxide and copper oxide particles were mixed together initially using 3.0 parts by weight of copper oxide to 1.0 part by weight of cadmium oxide. The particle sizes were broken down into the submicron range by ball milling the particles in toluol. The mixture was then dried in a standard oven maintained at approximately 110°C. Platinum and rhuthenium oxide particles were blended together with the copper oxide/cadmium oxide mixture and added to Reuche's Medium 163-C organic binder. The silver powder was then incorporated into this mixture and a wet three roll grinder was employed to provide a homogeneous composition. The composition was then coated on several ceramic substrates. The coating in this example was applied through hand brushing. The coated ceramic substrates were placed into an oven having an oxidizing atmosphere and being maintained at 925°C. The substrates were held in the oven for 5.0 minutes. The coated substrates were then removed and allowed to cool down to room temperature, approximating 21°C. Crystalline growth was observed and the bond strength of the layer to the ceramic was excellent. The coating had a bright metallic surface finish and visually appeared to be homogeneous. Attempts to remove the coating resulted in destruction of the ceramic.

The coated ceramic substrates were then dipped in hot soft solder. The solder used in this example was composed of 62% tin, 36% lead having 2.0% silver. The solder temperature was 225°C. and the substrates were held in the solder for 120 seconds. A small amount of leaching was observed where some of the silver possibly alloyed with the solder. It is believed that this was due to the lower percentage of platinum used in the composition. However, when removed from the solder, the bond strength remained excellent and the substrate remained solderable.

The example was repeated for differing weight parts of cadmium oxide and copper oxide with all other parameters remaining the same. The following table provides the example parameters.

Table 2a

| Copper Oxide (wt. parts) | Cadmium Oxide (wt. parts) | Bond Strength | Bond Observation |
|---|---|---|---|
| 0.15 | 1.0 | Low-Coating Scraped off | Low Crystalline Growth |
| 1.0 | 1.0 | Fair-Coating Removed with Knife Edge | Low Crystalline Growth |
| 4.0 | 1.0 | Excellent - Removal of Bond Through Destruction of Substrate | High Crystalline Growth/Not Homogeneous Particles Observable |
| 6.0 | 1.0 | Excellent - Removal of Bond Through Destruction of Substrate | High Crystalline Growth/Excess Copper Oxide Particles Seen |

EXAMPLE 3

| | |
|---|---|
| Cadmium Oxide + Copper Oxide | 1.0% |
| Platinum | 2.0% |
| Rhuthenium Oxide | 1.0% |
| Silver | 96.0% |

Cadmium oxide and copper oxide particles were blended together in a weight ratio of 3.0 parts of copper oxide to 1.0 parts of cadmium oxide. Particle size reduction was accomplished through ball milling in a toluol solution. After drying in an oven maintained at approximately 100°C., platinum and rhuthenium oxide particles were blended into the copper oxide and cadmium oxide composition. The entire mixture was incorporated into an organic binder comprising 90.0% by weight of the combined total of the overall metallizing composition. The organic binder used with Reuche's Medium 163-C. Silver powder was then mixed into the combined materials and mixed through use of a wet three roll grinder. The total composition was screened onto several pieces of ceramic substrate. The substrates were heated to 910°C. in an oxidizing atmosphere. The substrates were heated for approximately 8 minutes. The coated substrates were removed from the oven where they were heated and allowed to cool down to room temperature.

The silver was found to be bonded to the ceramic substrates and had a high bond strenght. Crystalline growth was observable and the coating had a homogeneous bright metallic finish. In attempts to remove the bond through use of a razor blade, the substrates were broken.

The remaining substrates were then hot dipped into soft solder having a temperature of 225°C. for a period of 120 seconds. The solder used in this example was 62% tin, 36% lead with 2.0% silver added (of the total weight of the solder). No leaching of the silver was observed. It is believed that the relatively high percentage of platinum slowed down any alloying of the silver with the solder. The substrates were removed and the bond strength was found to be substantially equivalent to the bond strength prior to the hot dipping. It is believed that the bond strength capability was maintained substantially constant through the hot dipping by the addition of the rhuthenium oxide to the total composition.

EXAMPLE 4

| | |
|---|---|
| Cadmium Oxide + Copper Oxide | 1.0% |
| Platinum | 0.5% |
| Rhuthenium Oxide | 0.5% |
| Silver | 98.0% |

Copper oxide and cadmium oxide particles were mixed together in a weight ratio of 3.0 parts of copper oxide to 1.0 part of cadmium oxide. This initial mixture was ball milled in a toluol solution until the particle size was in the sub-micron range. The mixture was dried in an oven for 5 hours at a temperature of approximately 110°C. Platinum and rhuthenium oxide particles were blended into the initial mixture to form a intermediate mixture of copper oxide, cadmium oxide, platinum and rhuthenium oxide particles. The intermediate mixture was incorporated into an organic binder (Reuche's Medium 163-C). The organic binder comprised 50.0% by weight of the overall metallizing composition weight (which includes the silver powder). Silver powder was then mixed into the combined materials and homogeneously mixed by use of a wet three roll grinder. The final mixture composition was screened onto a plurality of ceramic usbstrates. The substrates were heated to a temperature approximating 920°C in an oxidizing atmosphere. The substrates were heated for approximately 4.0 minutes. The coated substrates were removed from the oven and permitted to cool down to room temperatures through natural convection.

The silver was found to be bonded to the ceramic substrates and had a high bond strength. Crystalline growth was observed with crystals being seen to impregnate the surface of the ceramic substrate. The coating had a substantially homogeneous bright metallic finish.

The substrates were then hot dipped into soft solder heated to a temperature of approximately 225°C. The solder used in this example contained 62% tin and 36% lead with approximately 2.0% silver by weight of the total solder material. The substrates were held in the solder for approximately 120 seconds. After removal from the solder the bond strength of the coating was found to be slightly degraded. The coating bond was deemed fair but could be scraped from the substrate. It is believed that the reduction of rhuthenium oxide to only 0.5% by weight of the total composition caused the degradation of the bond strength.

This example was repeated utilizing the same weight percentage of cadmium oxide and copper oxide (1.0%) but with a weight ratio 6 parts of cadmium oxide to 1.0 part of copper oxide. All other physical parameters remained the same as in the first run of this example. Bonding of the silver to the ceramic substrate was accomplished, however, the bond was deemed to be of poor quality and was easily scraped from the substrate surface. After hot dipping in the soft solder, the bond was further degraded. In both sets of runs made for this example, no leaching of the silver was clearly observable in the hot dipping of the substrates in the solder.

EXAMPLE 5

| | |
|---|---|
| Cadmium Oxide + Copper Oxide | 1.0% |
| Platinum | 0.5% |
| Rhuthenium Oxide | 4.0% |
| Silver | 94.5% |

In this example set the percentage of rhuthenium oxide was increased to 4.0% by weight of the entire metallizing composition. AS was the usual procedure, cadmium oxide and copper oxide particles were incorporated into a wetting agent and ball milled. The weight composition of this initial mixture was 3.0 parts of copper oxide to 1.0 part of cadmium oxide, with the combination forming 1.0% by weight of the entire metallizing composition. The wetting agent used in this example was benzene and the initial mixture was milled for 3.0 hours until the particles were broken down substantially into the sub-micron range. The wetting agent was then removed through drying in an oven maintained at approximately 100°C. for 2.5 hours.

Platinum and rhuthenium oxide particles were blended together with the initial mixture and added to an organic binder, Reusche's Binder Medium No. 163-C. Silver powder was then mixed into the combination of cadmium oxide, copper oxide, and rhuthenium oxide. This total composition mixture was homogeneously mixed through use of a wet three roll grinder. The composition was then screened onto a plurality of ceramic substrates and introduced into an oven at 910°C. having an oxidizing atmosphere. The substrates were held in the oven for approximately 10 minutes, then removed and cooled to room temperature by natural convection.

The bond strength of the silver coating to the substrates was found to be excellent with crystalline growth being observed. It appeared that crystals had impregnated the ceramic substrate. Attempts to remove the coated layer from the substrates resulted in the breaking of the substrates.

The coated substrates were hot dipped into soft solder for 120 seconds. The solder was maintained at 225°C. and was a tin lead solder (62% tin, 36% lead) with 2.0% by weight of silver added. There was very little leaching of the silver observed. It is believed that little silver was scavenged away due to the platinum content of the mixutre. However, due to the increased percentage of rhuthenium oxide, it was found that the solder did not completely wet the surface. The resulting product was only deemed fair due to incomplete wetting, although the bond strength of the coating was not materially affected by the hot dipping.

EXAMPLE 6

| | |
|---|---|
| Cadmium Oxide + Copper Oxide | 2.0% |
| Platinum | 1.0% |
| Rhuthenium Oxide | 1.0% |
| Silver | 96.0% |

In order to determine the effect of increased percentages of cadmium oxide and copper oxide, an initial mixture was prepared where the cadmium oxide/copper oxide combination comprised 2.0% of the metallizing composition. The initial mixture consisted of 3.0 parts of copper oxide to 1.0 part of cadmium oxide. The initial mixture was incorporated into a wetting agent which was toluol, and ball milled for 1 hour. The initial mixture was then dried in an oven maintained at approximately 100°C. for about 3.0 hours.

Platinum and rhuthenium oxide particles were blended together with the dried initial mixture and added to Reusche's Medium Binder 163-C which comprised approximately 50.0% by weight of the solid composition weight. The composition was inserted into a wet three roll grinder and mixed until the composition was substantially homogeneous. The total composition was then coated on ceramic substrates by hand brushing and inserted into an oven having an oxidizing atmosphere for 6 minutes. The oven temperature was maintained at 900°C. The substrates were removed and cooled to room temperature (about 21°C.) through natural convection.

The resulting silver bond strength was excellent with removal of the bonded layer only being accomplished through destruction of the ceramic substrates. High crystalline growth was observed, however, the surface finish did exhibit some specks and was not completely homogenous in nature. The substrates were dipped in a soft solder as in the prior example for 120 seconds. Some leaching of the silver was found after removal from the solder bath due to the thinness of the coating. The bond strength did not appear to be materially affected.

The same percentages of materials were then run in ovens where the firing temperature and time were varied between 860° and 925°C. The results for the runs are as follows:

roll grinder mixed the components of the metallizing composition until a substantially homogeneous blend was achieved. The coated ceramic substrates were introduced into an oven maintained at approximately 890°C. and having an oxidizing atmosphere. The substrates were held in the oven for approximately 8 minutes, then removed and cooled to room temperature by natural convection.

The resulting bond of the silver to the ceramic substrate was found to be fair. Due to the lower percentage of copper oxide, crystalline growth was low. However, crystals were observed impregnating the ceramic surface. The coating layer was removed from the substrate by continual scraping the layer surface with a razor blade.

Coated substrates were hot dipped in 62%/36% tin-lead solder with 2.0% silver added. The solder composition was maintained at 225°C. and the substrates were held in the solder for approximately 120 seconds. Leaching of the silver layer was not observed. It is believed that the platinum content was sufficient to slow down the scavenging effect the the point that leaching was not observable. After removal from the solder composition, the bonded coating appeared to be slightly diminished in bond strength.

Table 6a

| Run | Oven Temp. | Firing Time | Comments |
|---|---|---|---|
| 1 | 860°C. | 15 min. | Incomplete firing/bond layer can be scraped away/non-homogeneous coating. |
| 2 | 860°C. | 4 min. | Incomplete firing/bond layer easily scraped away/very low crystalline growth observed. |
| 3 | 880°C. | 15 min. | Crystalline growth fair/bond farily good but can be scraped away/ homogeneous surface finish. |
| 4 | 880°C. | 4 min. | Crystalline growth low/poor bond/ non-homogeneous surface finish. |
| 5 | 925°C. | 15 min. | Crystalline growth high/excellent bond/possible overfire/surface finish streaked. |
| 6 | 925°C. | 4 min. | Acceptable crystalline growth/ excellent bond/possible overfire/ surface fairly homogeneous |

EXAMPLE 7

| | |
|---|---|
| Cadmium Oxide + Copper Oxide | 0.5% |
| Platinum | 0.5% |
| Rhuthenium Oxide | 1.0% |
| Silver | 98.0% |

The weight percentage of the initial mixture of cadmium oxide and copper oxide particles was reduced to 0.5% of the total composition mixture. The weight ratio of the initial mixture was 3.0 parts of copper oxide to 1.0 part of cadmium oxide. The initial mixture was incorporated into toluol and ball milled for 5 hours to break down the mixture particle sizes into the submicron range. The mixture was then dried in a standard oven at a temperature approximating 100°C. to remove the wetting agent.

Platinum and rhuthenium oxide particles were blended together with the initial mixture of copper oxide and cadmium oxide to form an intermediate composition. An organic binder, Reusche's Medium 163-C was added to the intermediate mixture. Silver powder was then mixed into the intermediate composition to form a total composition mixture. A wet three

EXAMPLE 8

| | |
|---|---|
| Cadmium Oxide + Copper Oxide | 5.0% |
| Platinum | 0.5% |
| Rhuthenium Oxide | 1.0% |
| Silver | 93.5% |

An initial mixture of cadmium oxide particles were mixed together in the combined weight amount of 5.0% of the total composition mixture. The weight composition ratio of this mixture was in the amount of 3.0 parts of copper oxide to 1.0 part of cadmium oxide. The initial mixture was blended into a toluol solution and ball milled for 1.5 hours until the mixture particles were substantially broken down into the sub-micron range. The mixture was then dried in a standard oven maintained at approximately 105°C. Platinum and rhuthenium oxide particles were blended together with the initial mixture and added to Reuche's Medium 163-C organic binder. Silver powder was then mixed into the intermediate composition of cadmium oxide, copper oxide, platinum and rhuthenium oxide as well as the organic binder. The organic binder weight percentage of the total composition mixture for this example was 75.0%. The total composition mixture was blended to a homogeneous mixture in a wet three roll grinder. The composition was brushed onto several pieces of ceramic substrate and introduced into an oven maintained at 900°C. having an oxidizing atmosphere. The substrates were held in the oven for approximately 5.0 minutes and then cooled to room temperature by natural convection.

The resulting bond of the silver to the ceramic substrate was excellent. High degree of crystalline growth was observed. The surface finish was not homogeneous and appeared to be spotty. Attempts to remove the coating layer resulted in the breaking of the substrates.

The remaining coated ceramics were hot dipped in the std. tin-lead solder with about 2.0% silver added for 120 seconds. Little scavaging of the silver was observed, however, the solder did not seem to uniformly wet the surface of the coating. The result was that solder was only applied to approximately 90% of the area (visual observation approximation). The soldering portion of the test was classified as a poor/fair soldering.

EXAMPLE 9

| | |
|---|---|
| Cadmium Oxide + Copper Oxide | 1.0% |
| Osmium | 0.5% |
| Rhuthenium Oxide | 1.0% |
| Silver | 97.5% |

In this example osmium was substituted for the platinum in the amount of 0.5% of the total composition mixture. Weight percentages of the cadmium oxide, copper oxide, rhuthenium oxide and silver were held at the levels shown in Example 1. The same procedure and physical parameters were also repeated in accordance with those described in Example 1. The bond strength of the silver layer was found to be excellent. Repeated scraping by a razor blade failed to remove the layer from the substrate. Hot dipping of the coated substrate in the solder showed little silver leaching. The solder bond remained of a high strength after being heated at 135°C. for 24 hours.

EXAMPLE 10

| | |
|---|---|
| Cadmium Oxide + Copper Oxide | 1.0% |
| Iridium | 0.5% |
| Ruthenium Oxide | 1.0% |
| Silver | 87.5% |

In this example iridium was substituted for the platinum in the amount of 0.5% of the total composition mixture. As in the case of Example 9, all physical parameters and procedures were followed in accordance with Example 1. The bond strength of the silver layer was found to be excellent. High crystalline growth was observed and a bright metallic finish of the coating was observed. Hot dipping of the coated substrate in the solder showed no silver leaching that was observable. No appreciable solder bond strength loss was seen after heating of the solder coated layer at 135°C. for 24 hours.

EXAMPLE 11

| | |
|---|---|
| Cadmium Oxide + Copper Oxide | 1.0% |
| Rhodium | 0.5% |
| Rhuthenium Oxide | 1.0% |
| Silver | 97.5% |

In this example, rhodium particulates were substituted for the platinum in the amount of 0.5% of the total composition mixture. All physical parameters and procedures were used in accordance with that shown in Ex. No. 1. The bond strength of the silver layer was found to be excellent (razor blade scraping resulted in the destruction of the substrate before the bond layer was scraped off). The coating had a bright metallic finish and crystalline growth was observed. Little leaching of the silver was observed when the coated substrates were immersed in the solder bath.

What is claimed is:

1. A metalizing composition comprising an intimate mixture on a weight basis, of: (a) about 0.5%–5.0% of an initial mixture of cadmium oxide powder and at least one copper oxide powder selected from the group consisting of cuprous oxide and cupric oxide, said copper oxide and cadmium oxide being combined in a weight ratio of between 0.15–6.0 parts of said copper oxide to 1.0 part of said cadmium oxide; (b) about 0.25%–2.0% of at least one particulate material selected from the group consisting of platinum, iridium, rhodium, and osmium powder; (c) about 0.50%–4.0% of rhuthenium oxide; (d) the balance of said intimate mixture being at least one silver particulate material selected from the group consisting of silver and silver oxide; and, said metalizing composition further including about 10.0%–95.0% by weight of said intimate mixture of an organic binder devoid of glass frits.

2. The metallizing composition as recited in claim 1 wherein said copper oxide powder is cuprous oxide.

3. The metallizing composition as recited in claim 2 wherein said weight percentage of said mixture of said cadmium oxide and said copper oxide is within the approximate range between 0.5%–2.0% of said intimate mixture.

4. The metallizing composition as recited in claim 3 wherein said weight ratio of said copper oxide and said cadmium oxide mixture is between 2.0–4.0 parts of said copper oxide to 1.0 part of said cadmium oxide.

5. The metallizing composition as recited in claim 3 wherein said weight percentage of said platinum powder is within the approximate range between 0.5%–1.0% of said intimate mixture.

6. The metallizing composition as recited in claim 5 wherein said weight percentage of said rhuthenium oxide is within the approximate range between 0.50%–2.0% of said intimate mixture.

7. The metallizing composition as recited in claim 6 wherein said weight percentage of said rhuthenium oxide approximates 1.0% of said intimate mixture.

8. The metallizing composition as recited in claim 1 wherein said copper oxide powder is cupric oxide.

9. The metallizing composition as recited in claim 8 wherein said weight percentage of said mixture of said cadmium oxide and said copper oxide is within the approximate range between 0.5%–2.0% of said intimate mixture.

10. The metallizing composition as recited in claim 9 wherein said weight ratio of said copper oxide and said cadmium oxide mixture is between 2.0–4.0 parts of said copper oxide to 1.0 part of said cadmium oxide.

11. The metallizing composition as recited in claim 9 wherein said weight percentage of said platinum powder is within the approximate range between 0.5%–1.0% of said intimate mixture.

12. The metallizing composition as recited in claim 11 wherein said weight percentage of said rhuthenium oxide is within the approximate range between 0.50%–2.0% of said intimate mixture.

13. The metallizing composition as recited in claim 12 wherein said weight percentage of said rhuthenium oxide approximates 1.0% of said intimate mixture.

14. The metallizing composition as recited in claim 13 wherein said weight percentage of said platinum powder approximates 0.5% of said intimate mixture.

15. The metallizing composition as recited in claim 14 wherein said weight percentage of said mixture of said cadmium oxide and said copper oxide approximates 1.0% of said intimate mixture.

16. The metallizing composition as recited in claim 15 wherein said weight ratio of said copper oxide and said cadmium oxide mixture is approximately 3.0 parts of said copper oxide to 1.0 part of said cadmium oxide.

* * * * *